United States Patent [19]

Shepard

[11] Patent Number: 4,554,728
[45] Date of Patent: Nov. 26, 1985

[54] SIMPLIFIED PLANARIZATION PROCESS FOR POLYSILICON FILLED TRENCHES

[75] Inventor: Joseph F. Shepard, Hopewell Junction, N.Y.

[73] Assignee: International Business Machines Corporation, Armonk, N.Y.

[21] Appl. No.: 624,876

[22] Filed: Jun. 27, 1984

[51] Int. Cl.$^4$ .................. H01L 21/22; H01L 21/302; H01L 21/76

[52] U.S. Cl. .................. 29/576 W; 29/578; 29/576 B; 148/1.5; 148/187; 148/188; 148/DIG. 50; 156/628; 156/643; 357/49; 357/55; 357/59

[58] Field of Search .............. 29/576 W, 577 C, 571, 29/578, 576 B; 148/1.5, 187, 188, DIG. 88, DIG. 86, DIG. 50; 156/628, 643; 357/49, 55, 59

[56] References Cited

U.S. PATENT DOCUMENTS

| 3,892,608 | 7/1975 | Kuhn | 148/188 |
| 3,969,168 | 7/1976 | Kuhn | 29/576 W X |
| 4,108,715 | 8/1978 | Ishikawa et al. | 156/628 |
| 4,233,091 | 11/1980 | Kawabe | 29/576 W X |
| 4,377,734 | 3/1983 | Mashiko et al. | 156/628 X |
| 4,391,033 | 7/1983 | Shinozaki | 29/576 W |
| 4,438,556 | 3/1984 | Komatsu et al. | 156/628 X |
| 4,455,740 | 6/1984 | Iwai | 29/576 W X |
| 4,472,240 | 9/1984 | Kameyama | 29/576 W X |

FOREIGN PATENT DOCUMENTS

| 0220445 | 12/1983 | Japan | 29/576 W |
| 0065447 | 4/1984 | Japan | 29/576 W |
| 0065448 | 4/1984 | Japan | 29/576 W |
| 0065449 | 4/1984 | Japan | 29/576 W |

Primary Examiner—Brian E. Hearn
Assistant Examiner—David A. Hey
Attorney, Agent, or Firm—T. Rao Coca; Anne Vachon Dougherty

[57] ABSTRACT

The method of planarizing polysilicon-filled trenches involves first filling the trenches with an undoped polysilicon until the upper surface is substantially planar. The polycrystalline silicon is then heavily doped by means of diffusion of a dopant from the upper surface. The time and temperature of the diffusion are carefully controlled providing for the dopant to penetrate the polysilicon to a depth level with the tops of the trenches. A selective etchant is then utilized which removes the heavily doped polysilicon and leaves the undoped polysilicon untouched in the trenches.

8 Claims, 3 Drawing Figures

SIMPLIFIED PLANARIZATION PROCESS FOR POLYSILICON FILLED TRENCHES

BACKGROUND OF THE INVENTION

This invention relates to the formation of trench, or groove patterns in semiconductor surfaces for the purpose of dielectric isolation. Separation or isolation of the semiconductor elements by the use of trenches filled with a dielectric material allows for increased density of the elements.

The current trench technology encompasses several trench filling and planarization techniques. One well-known method involves the steps of: etching a substrate to form the trenches; depositing the dielectric in the trenches which results in forming an excess dielectric layer on the upper surface of the adjacent substrate; and, finally, removing the excess layer by mechanically polishing the smoothing the dielectric layer back to the upper surface of the substrate at the level of the top of the filled trenches. This method involves the preliminary step, before the trench patterns are etched, of depositing a hard layer of material which is more resistant to mechanical polishing than is the subsequently deposited dielectric material. In the polishing process, the greater resistance to the polishing indicates to the polishing entity that the upper surface of the substrate, and therefore the top of the trenches, has been reached and that polishing should cease. At the same time, however, the hard resistant layer introduces greater stress on the substrate and, together with the mechanical polishing vibration, can weaken and degrade the device. Another drawback to this method, of utilizing the gross movement of a mechanical polisher, is the difficulty in achieving the accuracy desired for a semiconductor device.

A common alternative method currently in use involves depositing and then chemically etching the dielectric or polysilicon layer. The dielectric, or polysilicon, is deposited in the grooves or trenches until they are filled. In the process of filling the trench, a thick excess dielectric or polysilicon coating is necessarily deposited on the upper surface of the substrate between the trenches. The excess dielectric or polysilicon is then removed, and planarity reestablished, by a reactive ion etch back to the original substrate surface. Again, the method is relatively inexact and difficult to control.

Doping and selective etching have been employed in several recently developed methods of planarization of filled trenches in patterned semiconductors. U.S. Pat. No. 3,892,608 issued to Kuhn discloses a planarization method whereby a thin doped oxide layer is preliminarily deposited onto the grooved semiconductor substrate using a spin-on technique. Excess doped oxide found on the upper surface of the substrate is removed using standard photolithographic techniques, leaving the doped oxide in the grooves. An undoped polysilicon layer is then deposited over the entire surface and the substrate heated in order to drive the doping impurities from the doped oxide into the undoped polysilicon in the trenches. A selective etch is then used to remove the undoped polysilicon remaining on the upper surface of the substrate.

Similarly, U.S. Pat. No. 4,391,033 issued to Shinozaki, makes use of an upward diffusion of a doping impurity from a previously deposited layer and the subsequent use of a selective etchant. Shinozaki's doping of the polysilicon layer results from the utilization of not only the upward diffusion but also simultaneous diffusion in from the top surface of the layer, whereby, the doping process is stopped when the impurities meet at the "center" of the polysilicon layer. Shinozaki presumes a conformally filled trench having the geometric uniformity necessary for its concurrent doping methods. Such exactness in deposition is impractical under batch conditions and is, in fact, extremely difficult to achieve unless extremely thin fills are used. Alternatively, Shinozaki teaches ion implantation and thermal activation of the implanted boron impurities.

Each of the above-referenced patents involves the deposition of additional layers introducing additional time and cost factors along with the obvious drawbacks of greater opportunity for errors, and inexactness in both the deposition and the doping steps, and greater stress on the substrate due to repeated deposition and heating steps.

SUMMARY OF THE INVENTION

It is, therefore, an objective of the subject invention to provide a simple method for forming a dielectric or polysilicon filled trench isolation pattern on a semiconductor substrate.

It is another objective of this invention to maintain a high level of substrate integrity in processing the substrate for increased integration and density of components via a dielectric isolation pattern.

It is a further objective of the invention to provide a method for achieving a high degree of planarity between the upper substrate surface and the upper surface of the dielectric or polysilicon in the filled trench.

Finally, it is an objective to provide a method of producing semiconductor substrates having good isolation characteristics while using a small number of economical steps suitable for batch processing.

These and other objectives are accomplished by the subject inventive method which involves filling the isolation trenches with an undoped dielectric or polysilicon leaving an excess layer above the plane of the upper surface of the substrate both on the substrate and in the trench region; heavily doping the excess layer by means of a diffusion from the top surface; stopping the doping diffusion at the top of the trench, as defined by the plane of the upper surface of the substrate; and, utilizing a selective etchant to remove only the heavily doped dielectric or polysilicon, leaving the undoped dielectric or polysilicon to remain in the trench.

BRIEF DESCRIPTION OF THE DRAWINGS

FIG. 3 is a cross-sectional view showing the planar semiconductor substrate with the filled and planarized isolation trench formed in accordance with the subject inventive method.

DETAILED DESCRIPTION OF THE INVENTION

Figure 1:
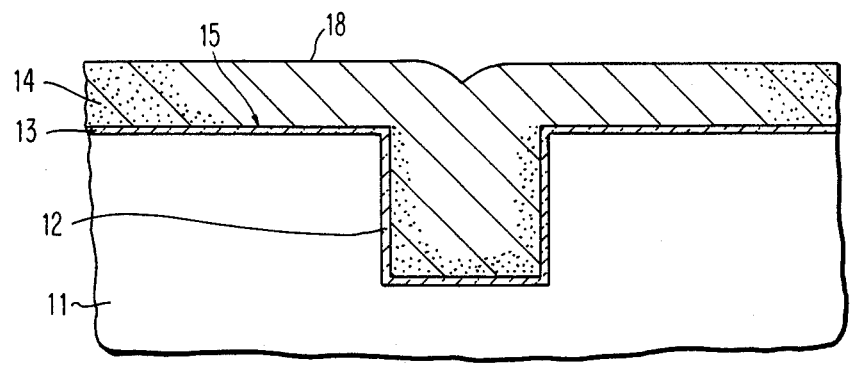
FIGS. 1, 2 and 3 are cross-sectional views sequentially illustrating the steps of one embodiment of the invention.
Figure 2:
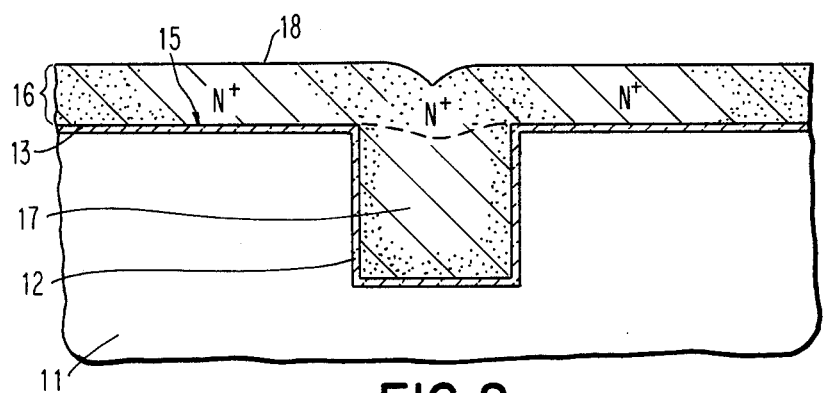
Figure 3:
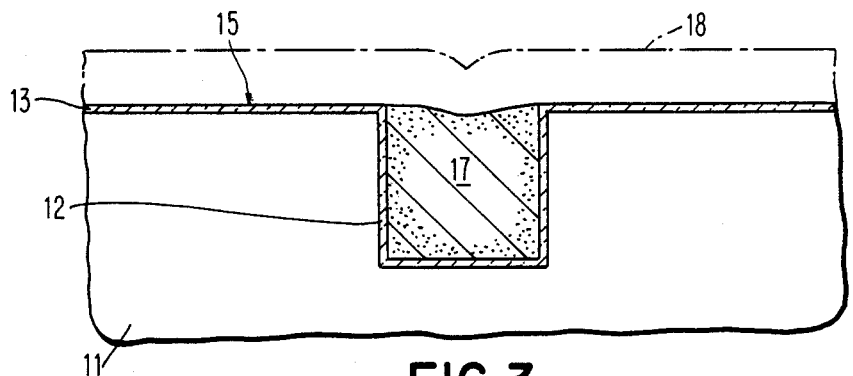

One embodiment of the invention is illustrated in FIGS. 1, 2 and 3. The invention will be described with reference to those figures.

A series or pattern of trenches in a semiconductor substrate, 11, is produced by reactive ion etch or other appropriate etching technique. The trench or groove, 12, is etched into the substrate, 11, commonly silicon, to form an isolation pattern. The illustrated substrates are vertically etched to form rectangular trenches, however, angled trenches such as V-shaped and trapezoidal cuts are consistent with the subsequent disclosure. An oxide, or similar insulating layer 13, is then formed on the upper surface, 15, of the substrate and in the trench 12. When a silicon substrate is used, the silicon may be exposed to an oxidizing atmosphere in order to provide the patterned substrate with the insulation characteristics of $SiO_2$. The trench, 12, is then filled with a semiconductor layer 14 to a level of fill above the upper surface of the substrate 15. The semiconductor layer 14, such as polysilicon, is deposited until the trench 12 is filled and until the top 18 of the deposited layer is substantially planar. This filling process, conducted via any well-known deposition technique such as chemical vapor deposition, will necessarily deposit an excess layer, of the semiconductor being deposited, onto the upper surface 15 of the insulated substrate. It is necessary, therefore, to achieve removal of that excess layer and exposure of the insulated substrate for additional processing. This is done in a manner sufficient to leave the trench filled with the semiconductor material at a level substantially even with the plane of the upper insulated substrate surface, 15; thereby reestablishing the planarity of the patterned substrate. In order to accomplish this goal, a difference in impurity concentration is introduced into layer 14 between the part, 16, of the deposited semiconductor layer which is found above the plane of the upper surface of the substrate and the semiconductor, 17, found in the trenches below that plane. In the illustrated embodiment, FIG. 2, the polysilicon fill layer 14 is doped to make the upper part, 16, heavily $n^+$. The doping is done in a vertical direction by diffusion in from the top surface 18 of the deposited layer; for example, in an ambient atmosphere of $POCl_3$. The diffusion front or depth can be stopped at a precise level by control of the time, t, and temperature, T, of the diffusion process in accordance with well-known teachings; the diffusion progressing in depth by a factor of $\sqrt{t}$ at a given T. By controlling t and T, the diffusion can be stopped at the upper surface 15 of the insulated substrate. Therefore, in the illustrated embodiment, the polysilicon, 16, above the plane of the upper substrate surface, 15, is now heavily $n^+$; and the polysilicon 17 in the trenches below that plane remains undoped. The layer, 16, found above the plane defined by the upper surface 15 of the substrate must now be removed. This is easily done by utilizing the impurities which were introduced into that layer. In the illustrated embodiment, the $n^+$ polysilicon layer 16 is removed by the use of an appropriate selective etchant, such as a wet etch of 20 $HNO_3$:1HF or hot $H_3PO_4$, or a dry plasma etch such as $CCl_2F_2$ The known properties of an appropriate selective etchant dictate that it will etch material exhibiting one or of high conductivity but not material of low or the opposite conductivity type. As such, the etchant will remove the unwanted excess layer 16 and expose the upper surface of the insulated substrate 15 and the upper surface of the filled trench. The result, as shown in FIG. 3, is a planar substrate, with a dielectric isolation pattern, ready for further processing. Any choice of semiconductor layer material, subsequently introduced impurity and selective etchant is herein anticipated. For example, the semiconductor layer may be heavily p-type ($p^+$) when deposited and the subsequent impurity introduction be a counterdoping to $n^+$; or the excess layer may be doped heavily with p-type impurities and etched to leave the nominally doped polysilicon. The needs or requirements of the ultimate product may dictate the composition and conductivity of the material which will be left in the isolation trenches of the final product. The only requirement in choosing deposited layers and impurity types is the need to have some selective etchant which will distinguish between the layers removing only the excess, upper surface, layer according to its impurities.

While the invention has been particularly shown and described with reference to a preferred embodiment, it will be understood by those skilled in the art that modifications in detail may be made without departing from the spirit and scope of the invention.

What is claimed is:

1. A method of forming dielectric isolation in a semiconductor substrate comprising the steps of:
    forming a pattern of trenches into one surface of said semiconductor substrate;
    forming conformally an insulating layer on said substrate and in said trenches;
    forming a single semiconductor layer over the insulating layer thereby filling the trenches and covering the upper surface of the insulated substrate until the top of said semiconductor layer is substantially planar;
    introducing in a vertically downward direction an impurity into the semiconductor layer from the top surface of said semiconductor layer to the depth of the upper surface of the insulated substrate whereby the impurity concentration of the semiconductor layer found in the trenches is substantially lower than the impurity concentration of the semiconductor layer found above the level of and on the upper surface of the insulated substrate; and,
    selectively removing the semiconductor layer found above the level of and on the upper surface of the insulated substrate by utilizing the difference in impurity concentrations,
    whereby is obtained semiconductor-filled trenches having upper surfaces in substantial planarity with the substrate surface, 2. The method of forming dielectric isolation in a semiconductor substrate as found in claim 1, wherein the semiconductor substrate is comprised of silicon.

3. The method of forming dielectric isolation in a semiconductor substrate as found in claim 2 wherein the insulating layer is $SiO_2$ formed by oxidation of the silicon.

4. The method of forming dielectric isolation in a semiconductor substrate as found in claim 1 wherein said semiconductor substrate layer is comprised of undoped polycrystalline silicon.

5. The method of forming dielectric isolation in a semiconductor substrate as found in claim 4 wherein the impurity introduced into the polycrystalline silicon is an n-type impurity diffused in from the top surface in an ambient atmosphere of $POCl_3$.

6. The method of claim 5 whereby the selective removal is accomplished by a wet etch of 20 $HNO_3$:1HF, removing the heavily doped excess layer and leaving the nominally doped polysilicon in the trenches.

7. The method of claim 1 whereby the impurity introduction is by a diffusion process.

8. A method of forming dielectric isolation in a semiconductor substrate comprising:
    providing a silicon substrate having a planar surface;

forming at least one trench on the planar surface of said substrate;

forming conformally a silicon dioxide layer on said substrate planar surface and the surfaces of said trench;

depositing an undoped polysilicon layer over the oxide layer, filling said trench and covering the upper surface of the oxide-covered substrate until top of the deposited polysilicon is substantially planar;

diffusing in a vertically downward direction an impurity into said polysilicon from the top surface thereof to the depth of the upper surface of the oxide-covered substrated to render the polysilicon found above the level of and on the upper surface of the oxide-covered substrate highly doped while maintaining the polysilicon found in said trench undoped; and selectively etching said heavily doped polysilicon while leaving in tact said undoped polysilicon;

whereby is obtained at least one polysilicon-filled trench having an upper surface in substantial planarity with the substrate planar surface.

* * * * *